(12) United States Patent
Liao et al.

(10) Patent No.: US 10,026,759 B2
(45) Date of Patent: Jul. 17, 2018

(54) ARRAY SUBSTRATE AND MANUFACTURING METHOD THEREFOR, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanping Liao, Beijing (CN); Bin Feng, Beijing (CN); Xibin Shao, Beijing (CN); Zhenyu Zhang, Beijing (CN); Qiliang Gong, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/131,028

(22) Filed: Apr. 17, 2016

(65) Prior Publication Data
US 2016/0307933 A1 Oct. 20, 2016

(30) Foreign Application Priority Data
Apr. 17, 2015 (CN) .......................... 2015 1 0185435

(51) Int. Cl.
*H01L 27/12* (2006.01)
*H01L 23/60* (2006.01)
(Continued)

(52) U.S. Cl.
CPC .... *H01L 27/1244* (2013.01); *G02F 1/136227* (2013.01); *H01L 23/5225* (2013.01); *H01L 23/60* (2013.01); *H01L 27/1262* (2013.01)

(58) Field of Classification Search
CPC ....... H01L 2225/06537; H01L 27/1244; H01L 23/5225; H01L 23/60; G02F 2001/133334; G02F 2001/136218
See application file for complete search history.

(56) References Cited

U.S. PATENT DOCUMENTS

| | | | |
|---|---|---|---|
| 2011/0261010 A1* | 10/2011 | Nishitani | G06F 3/044 345/174 |
| 2014/0204301 A1 | 7/2014 | Nakagawa | |
| 2015/0357293 A1* | 12/2015 | Tomita | H01L 23/585 257/629 |

FOREIGN PATENT DOCUMENTS

| | | |
|---|---|---|
| CN | 101894826 A | 11/2010 |
| CN | 102280436 A | 12/2011 |

(Continued)

OTHER PUBLICATIONS

First Office Action regarding Chinese Application No. 201510185435.2, dated Mar. 22, 2017. Translation provided by Dragon Intellectual Property Law Firm.

*Primary Examiner* — Thanhha Pham
(74) *Attorney, Agent, or Firm* — Harness, Dickey & Pierce, P.L.C.

(57) ABSTRACT

Disclosed are an array substrate and a manufacturing method therefor, and a display panel. The array substrate includes a first metal layer including a first pattern; a second metal layer including a second pattern; a conduction layer located above the first metal layer and the second metal layer and including a third pattern; a first via hole adapted to connect the first pattern and the third pattern; a second via hole adapted to connect the second pattern and the third pattern; and a conductive material shielding ring surrounding the third pattern, where the conductive material shielding ring is insulated from the third pattern.

18 Claims, 4 Drawing Sheets

(51) Int. Cl.
*H01L 23/522* (2006.01)
*G02F 1/136* (2006.01)
*G02F 1/1362* (2006.01)

(56) References Cited

FOREIGN PATENT DOCUMENTS

| | | |
|---|---|---|
| CN | 102299136 A | 12/2011 |
| CN | 102412228 A | 4/2012 |
| CN | 103489824 A | 1/2014 |

* cited by examiner

ARRAY SUBSTRATE AND MANUFACTURING METHOD THEREFOR, AND DISPLAY PANEL

CROSS-REFERENCE TO RELATED APPLICATION

The present application claims a priority to Chinese patent application No. 201510185435.2 filed on Apr. 17, 2015, which is incorporated herein by reference in its entirety.

TECHNICAL FIELD

The present disclosure relates to the field of display technology, and in particular to an array substrate and a manufacturing method therefor, and a display panel.

BACKGROUND

At present, during manufacture of the thin film transistor-liquid crystal display (TFT-LCD), via holes are designed in a conventional manner, i.e., a conduction layer is used as a connection medium.

In general, for implementing electrical connection between different metal layers, a via hole process is performed at corresponding locations of two metal layers which need to be connected, and a conduction layer is then arranged covering a surface of the via hole, such that electrical connection between different metal layers is implemented. However, in the related art, as shown in FIG. 1, a conduction layer exposed on the surface of the via hole is prone to be corroded due to influence of surrounding electric field, thereby resulting in problems such as contact failure between different metal layers.

SUMMARY

Regarding the defects in the related art, an array substrate and a manufacturing method therefor, and a display panel are provided in the present disclosure, for effectively preventing corrosion of a conduction layer exposed on a surface of a via hole.

In a first aspect, it is provided an array substrate in the present disclosure, including:
a first metal layer including a first pattern;
a second metal layer including a second pattern;
a conduction layer located above the first metal layer and the second metal layer and including a third pattern;
a first via hole adapted to connect the first pattern and the third pattern;
a second via hole adapted to connect the second pattern and the third pattern; and
a conductive material shielding ring surrounding the third pattern, where the conductive material shielding ring is insulated from the third pattern.

Alternatively, the conduction layer is arranged at a layer and made of a material identical to the conductive material shielding ring.

Alternatively, the conduction layer is made of a transparent conductive metal oxide or a metal.

Alternatively, the transparent conductive metal oxide is indium tin oxide.

Alternatively, the conductive material shielding ring may include a first conductive material portion and a second conductive material portion, the conduction layer is arranged at a layer and made of a material identical to the first conductive material portion, and the second metal layer is arranged at a layer and made of a material identical to the second conductive material portion. The second metal layer is located between the first metal layer and the conduction layer.

Alternatively, the first conductive material portion and the second conductive portion each may have a half-frame shape, a semi-circle shape or any other shape having two ends.

Alternatively, the first conductive material portion and the second conductive material portion are connected via third via holes, a whole structure of the first conductive material portion, the second conductive material portion and the third via holes may surround the third pattern of the conduction layer.

Alternatively, two ends of the first conductive material portion respectively overlap two ends of the second conductive material portion in a direction perpendicular to the conduction layer, and the third via holes are provided at regions where the first conductive material portion overlaps the second conductive material portion.

Alternatively, the first conductive material portion is insulated from the conduction layer and the second conductive material portion is insulated from the second metal layer.

Alternatively, one of the first metal layer and the second metal layer is a gate metal layer, and the other is a source/drain metal layer.

Alternatively, the first metal layer and the second metal layer are located at different layers.

In a second aspect, it is provided a method for manufacturing an array substrate in the present disclosure, including steps of:
forming a first metal layer including a first pattern;
forming a second metal layer including a second pattern;
forming a conduction layer including a third pattern and located above the first metal layer and the second metal layer;
forming a first via hole and a second via hole, where the first via hole is adapted to connect the first pattern and the third pattern and is covered by the third pattern, and the second via hole is adapted to connect the second pattern and the third pattern and is covered by the third pattern; and
forming a conductive material shielding ring surrounding the third pattern, where the conductive material shielding ring is insulated from the third pattern.

Alternatively, the conductive material shielding ring is formed while forming the conduction layer.

Alternatively, the conductive material shielding ring may include a first conductive material portion and a second conductive material portion; and
the step of forming a conductive material shielding ring surrounding the third pattern may include: forming the first conductive material portion near the conduction layer while forming the conduction layer, and forming the second conductive material portion near the second metal layer while forming the second metal layer. The second metal layer is formed between the first metal layer and the conduction layer.

Alternatively, the method for manufacturing the array substrate may further include: forming third via holes adapted to connect the first conductive material portion and the second conductive material portion.

In a third aspect, it is further provided a display panel in the present disclosure, including the array substrate described above.

As can be seen from the above technical solutions, in the array substrate and the manufacturing method therefor, and the display panel provided in the present disclosure, the conductive material shielding ring is provided surrounding the third pattern of the conduction layer, thereby effectively preventing corrosion of the conduction layer exposed on the surface of the via holes. Hence, contact failure between different conductive metal layers due to corrosion of the conduction layer is avoided during use, and service life of a product is longer.

Figure 1:
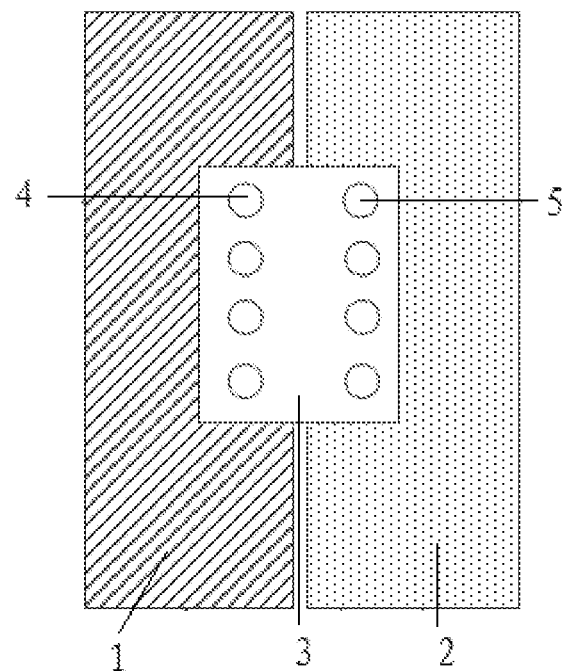
FIG. 1 is a schematic structural diagram of an array substrate in the related art.

Reference numerals in the drawings are described as follows:

1: first metal layer; 2: second metal layer; 3: conduction layer; 4: first via hole; 5: second via hole; 6: conductive material shielding ring; 7: first conductive material portion; 8: second conductive material portion; 9: third via hole; 10: overlapping area.

DETAILED DESCRIPTION OF THE EMBODIMENTS

Specific embodiments of the present disclosure are further described in detail below in conjunction with accompanying drawings. The following embodiments are merely intended to illustrate technical solutions of the present disclosure more clearly, but not to limit the protection scope of the present disclosure.

Figure 2:
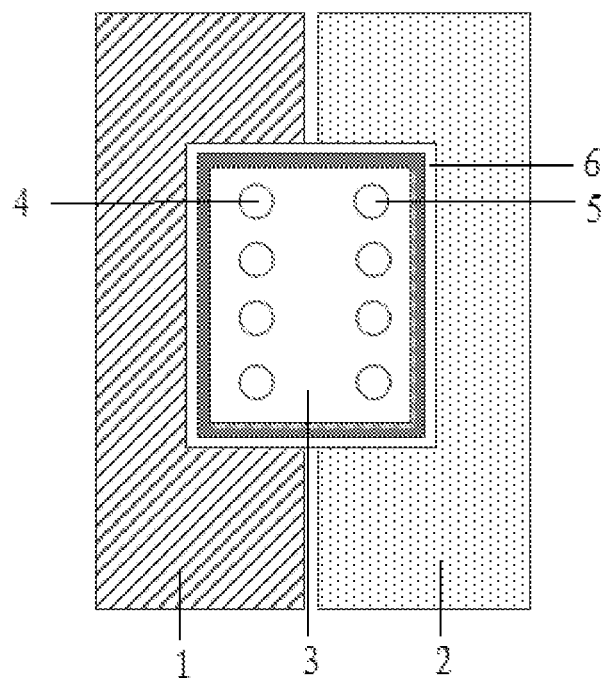
FIG. 2 is a schematic structural diagram of an array substrate according to some embodiments of the present disclosure.

FIG. 2 illustrates a schematic structure of an array substrate according to some embodiments of the present disclosure. As shown in FIG. 2, the array substrate includes:

a first metal layer 1 including a first pattern;

a second metal layer 2 including a second pattern;

a conduction layer 3, located above the first metal layer 1 and the second metal layer 2 and including a third pattern;

a first via hole 4 adapted to connect the first pattern and the third pattern;

a second via hole 5 adapted to connect the second pattern and the third pattern; and a conductive material shielding ring 6 surrounding the third pattern, where the conductive material shielding ring 6 is insulated from the third pattern.

The first pattern, the second pattern and the third pattern are located respectively in the first metal layer 1, the second metal layer 2 and the conduction layer 3. Actually, a part of each layer shown in FIG. 2 is mainly a corresponding pattern part included in each layer. Thus, for the purpose of clarity, reference numerals of the first pattern, the second pattern and the third pattern are not shown in the drawings. Further, each layer is illustrative. It should be understood that, the first metal layer 1 and the second metal layer 2 are generally located at different layers, one or more insulating layers are generally located between the first metal 1 and the conduction layer 3, and one or more insulating layers are generally located between the second metal layer 2 and the conduction layer 3, and via holes penetrate through corresponding insulating layer(s), where the insulating layers are not shown in FIG. 2.

One of the first metal layer and the second metal layer may be a gate metal layer, and the other may be a source/drain metal layer. Alternatively, the first metal layer and the second metal layer may be other metal layers, which is not limited specifically in the embodiments and is only intended for illustration with examples.

For example, in a case that the array substrate above is of an bottom-gate structure, the first metal layer 1 is a gate metal layer, the second metal layer 2 is a source/drain metal layer. A first insulating layer is formed on the first metal layer 1, the second metal layer 2 is formed on the first insulating layer, a second insulating layer is formed on the second metal layer 2, and the conduction layer 3 is formed on the second insulating layer. The conduction layer 3 may be made of a transparent conductive metal oxide or a metal. Specifically, the transparent conductive metal oxide is indium tin oxide. The conduction layer 3 is a third metal layer formed directly on the second insulating layer when the conduction layer 3 is made of a metal. The conduction layer 3 is a transparent conduction layer formed on the second insulating layer when the conduction layer 3 is made of a transparent conductive metal oxide. The first via hole 4 penetrates through the first insulating layer and the second insulating layer, and the second via hole 5 penetrates through the second insulating layer.

Similarly, in a case that the array substrate above is of a top-gate structure, the first metal layer 1 is a source/drain metal layer, the second metal layer 2 is a gate metal layer. A first insulating layer is formed on the first metal layer 1, the second metal layer 2 is formed on the first insulating layer, a second insulating layer is formed on the second metal layer 2, and the conduction layer 3 is formed on the second insulating layer. The conduction layer 3 may be made of a transparent conductive metal oxide or a metal. Specifically, the transparent conductive metal oxide is indium tin oxide. The conduction layer 3 is a third metal layer formed directly on the second insulating layer when the conduction layer 3 is made of a metal. The conduction layer 3 is a transparent conduction layer formed on the second insulating layer when the conduction layer 3 is made of a transparent conductive metal oxide. The first via hole 4 penetrates through the first insulating layer and the second insulating layer, and the second via hole 5 penetrates through the second insulating layer.

In the array substrate above, the conductive material shielding ring 6 surrounding the third pattern is arranged around the third pattern of the conduction layer 3, thereby reducing influence of surrounding electromagnetic field on the third pattern and effectively preventing corrosion of the conduction layer exposed on surfaces of the first via hole and the second via hole. Hence, contact failure between different conductive metal layers, i.e., between the first metal layer 1 and the second metal layer 2, due to corrosion of the conduction layer 3 is avoided during use, and service life of a product is longer.

The conductive material shielding ring 6 surrounding the third pattern may be understood with the following implementations: the conductive material shielding ring 6 and the conduction layer 3 may be located at the same layer; or the conductive material shielding ring 6 and the conduction layer 3 may be located at different layers; or the conduction layer 3 and a part of the conductive material shielding ring 6 are located at the same layer, and the conduction layer 3 and another part of the conductive material shielding ring 6 are located at different layers; as long as the conductive material shielding ring 6 surrounding the third pattern of the conduction layer 3 is formed around the third pattern of the conduction layer 3 and protects the third pattern from being influenced by surrounding electromagnetic field.

Figure 3:
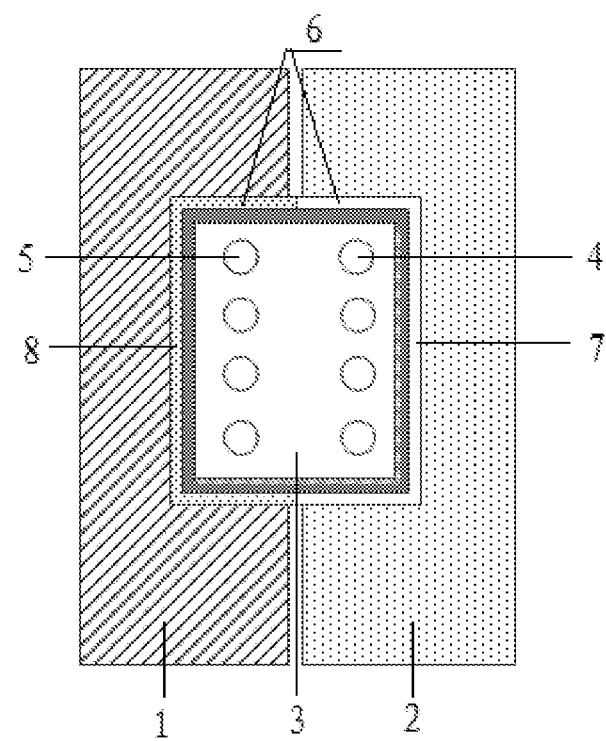
FIG. 3 is a schematic structural diagram of an array substrate according to some embodiments of the present disclosure.

In some embodiments of the present disclosure, as shown in FIG. 3, the conductive material shielding ring may include a first conductive material portion 7 and a second conductive material portion 8. Specifically, the conduction layer 3 is arranged at a layer and made of a material identical to the first conductive material portion 7, the second metal layer 2 is arranged at a layer and made of a material identical to the second conductive material portion 8, and the second metal layer 2 is located between the first metal layer 1 and the conduction layer 3. The first conductive material portion 7 and the second conductive material portion 8 are connected via third via holes.

Structures of the array substrate described above are explained in detail below, and may include three structures as follows specifically. The conductive material shielding ring 6 in each of the three structures can prevent corrosion of the conduction layer 3 exposed on surfaces of the first via hole 4 and the second via hole 5. The present disclosure is limited to the following three structures which are merely illustrative.

A first structure is shown in FIG. 2, the conduction layer 3 is made of a transparent conductive metal oxide. Specifically, the conduction layer 3 is a transparent conduction layer made of indium tin oxide. The transparent conduction layer is arranged at a layer and made of a material identical to the conductive material shielding ring 6. The conductive material shielding ring 6 surrounds the third pattern of the transparent conduction layer. The conductive material shielding ring 6 is formed by means of a pattering process while forming the transparent conduction layer. With such structure, during manufacture of the array substrate, it is not necessary to manufacture the conductive material shielding ring 6 through a separate patterning process. In addition, the conductive material shielding ring 6 in the structure can effectively prevent corrosion of the transparent conduction layer exposed on surfaces of the first via hole 4 and the second via hole 5. Specifically, the conductive material shielding ring is insulated from the third pattern of the transparent conduction layer.

In a second structure, the conduction layer 3 is a third metal layer made of a metal. Specifically, a shielding ring 6 surrounding the third pattern of the third metal layer is formed while forming the third metal layer. The shielding ring 6 and the third metal layer are made of the same material, and the shielding ring 6 is insulated from the third pattern of the third metal layer. With such structure, during manufacture of the array substrate, it is not necessary to manufacture the shielding ring 6 through a separate patterning process. In addition, the shielding ring 6 in the structure can effectively prevent corrosion of the conduction layer exposed on surfaces of the first via hole 4 and the second via hole 5.

In a third structure, the conductive material shielding ring 6 is divided into a first conductive material portion 7 and a second conductive material portion 8, the conduction layer 3 is arranged at a layer and made of a material identical to the first conductive material portion 7, and the second metal layer 2 is arranged at a layer and made of a material identical to the second conductive material portion. The second metal layer 2 is located between the first metal layer 1 and the conduction layer 3. That is, a first insulating layer is formed on the first metal layer 1; while forming the second metal layer 2 on the first insulating layer, the second conductive material portion 8 is formed near the second metal layer 2; a second insulating layer is formed on the second metal layer; while forming the conduction layer 3 on the second insulating layer, the first conductive material portion 7 is formed near the conduction layer 3. Specifically, it should be understood that, the first conductive material portion 7 and the conduction layer 3 are located at the same layer and formed by means of one patterning process; and the second conductive material portion 8 and the second metal layer 2 are located at the same layer and formed by means of one patterning process.

Figure 4:
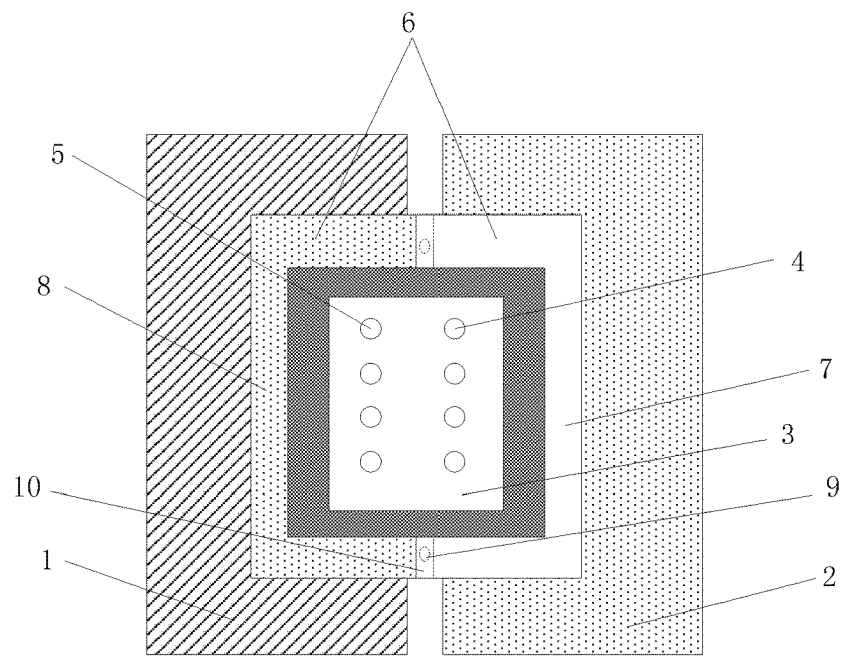
FIG. 4 is a schematic structural diagram of an array substrate according to some embodiments of the present disclosure.
Figure 5:
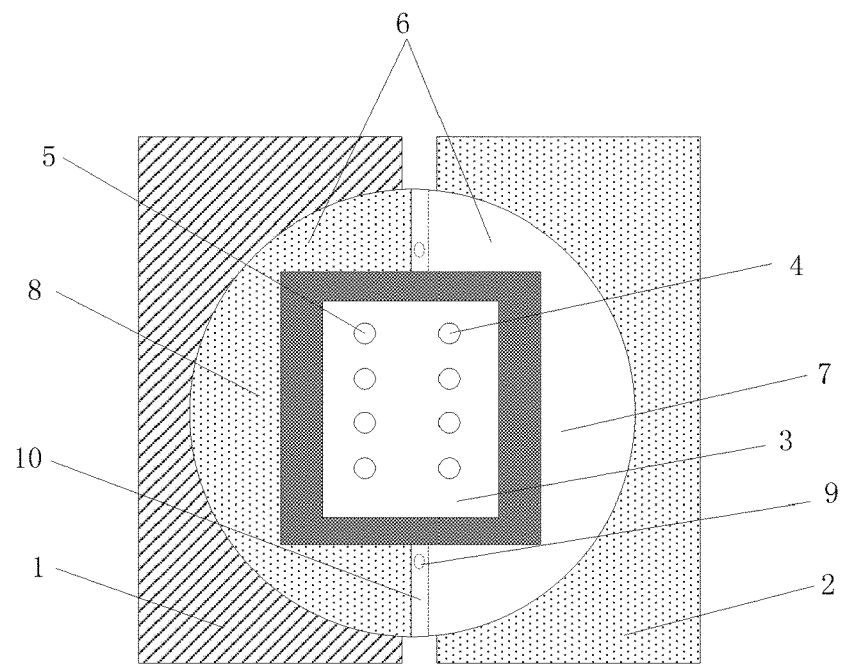
FIG. 5 is a schematic structural diagram of an array substrate according to some embodiments of the present disclosure.
Figure 6:
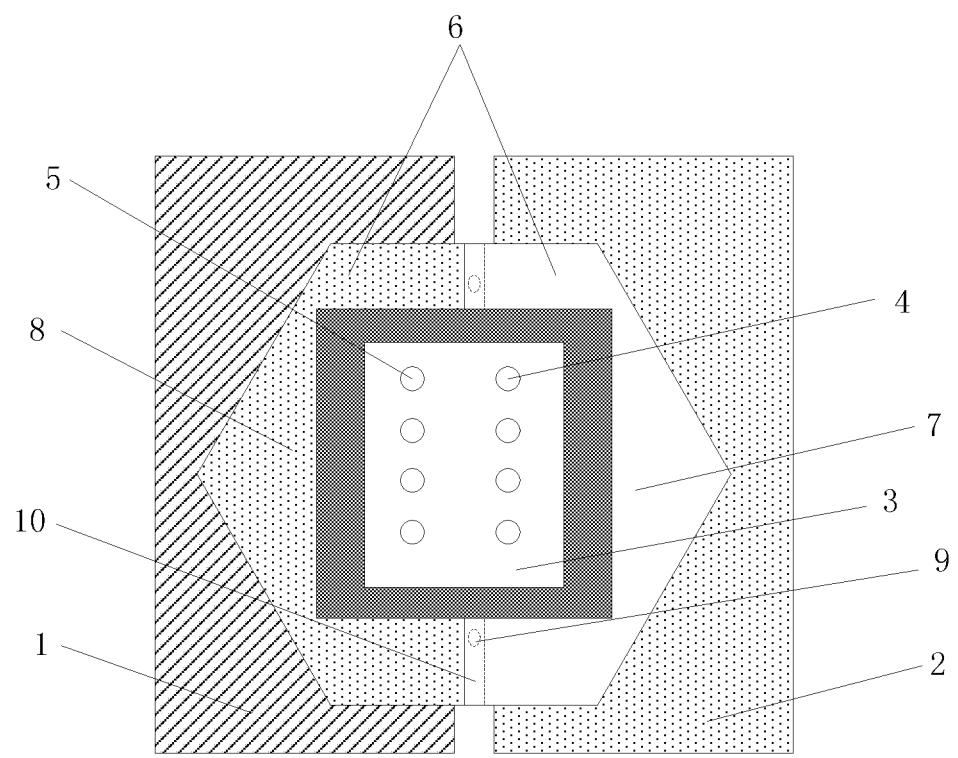
FIG. 6 is a schematic structural diagram of an array substrate according to some embodiments of the present disclosure.

It should be noted that, the first conductive material portion 7 and the second conductive material portion 8 are located at different layers of the array substrate, and each of the first conductive material portion 7 and the second conductive material portion 8 may be a continuous structure, or may include several discontinuous parts. Each of the first conductive material portion 7 and the second conductive portion 8 may have a half-frame shape, a semi-circle shape or any other shape having two ends as long as a whole structure of the first conductive material portion 7 and the second conductive portion 8 surrounds the third pattern of the conduction layer 3. As shown in FIGS. 3 and 4, the first conductive material portion 7 and the second conductive portion 8 are of a half-frame shape, as shown in FIG. 5, the first conductive material portion 7 and the second conductive portion 8 are of a semi-circle shape, and as shown in FIG. 6, the first conductive material portion 7 and the second conductive portion 8 are of a polygon shape. The first conductive material portion 7 and the second conductive material portion 8 may be connected via third via holes such that a closed shielding ring 6 is formed. For example, as shown in FIG. 4, two ends of the first conductive material portion 7 respectively overlap two ends of the second conductive material portion 8 at the overlapping area 10 in a direction perpendicular to the conduction layer 3, and the third via holes 9 are provided at the overlapping area where the first conductive material portion 7 overlaps the second conductive material portion 8. The third via holes 9 may be provided between the second metal layer 2 and the conduction layer 3, adapted to connect the first conductive material portion 7 and the second conductive portion 8 such that the two ends of the first conductive material portion 7 are respectively connected to the two ends of the second conductive material portion 8 to form a closed shielding ring 6. Alternatively, the two ends of the first conductive material portion 7 and the two ends of the second conductive material portion 8 may be connected in other connection manners instead of through the third via holes, which are not illustrated in detail in the embodiments.

With such structure, since the first conductive material portion 7 is formed while forming the conduction layer 3 and the second conductive material portion 8 is formed while forming the second metal layer 2, separate processes for manufacturing the first conductive material portion 7 and the second conductive material portion 8 are removed. In addition, the conductive material shielding ring 6 in the structure can effectively prevent corrosion of the conduction layer 3 exposed on surfaces of the via hole 4 and the via hole 5. Specifically, the first conductive material portion 7 is generally insulated from the conduction layer 3 and the second conductive material portion 8 is generally insulated from the second metal layer 2.

It is further provided a method for manufacturing an array substrate in the present disclosure. Taking the manufacture of the array substrate in the above embodiments as an example, the method for manufacturing the array substrate includes following steps S1 to S6.

In step S1, a first metal layer 1 including a first pattern is formed.

In step S2, a second metal layer 2 including a second pattern is formed.

In step S3, a conduction layer 2 is formed, which includes a third pattern and is located above the first metal layer 1 and the second metal layer 2.

In step S4, a first via hole 4 is formed, where the first via hole 4 is adapted to connect the first pattern and the third pattern and is covered by the third pattern.

In step S5, a second via hole 5 is formed, where the second via hole 5 is adapted to connect the second pattern and the third pattern and is covered by the third pattern.

In step S6, a conductive material shielding ring 6 is formed surrounding the third pattern, where the conductive material shielding ring 6 is insulated from the third pattern.

In the step S1 described above, the first metal layer 1 may be formed in a manner of vacuum deposition or magnetron sputtering and the first pattern may be formed through a patterning process, for example, etching. In other steps, processes for forming the second metal layer 2 including the second pattern and the conduction layer 3 including the third pattern are same as that for forming the first metal layer 1 including the first pattern in step S1, which are not explained in detail in the embodiments.

It should be understood that, the first metal layer 1 and the second metal layer 2 are generally located at different layers. One or more insulating layers are generally provided between the first metal layer 1 and the conduction layer 3, and one or more insulating layers are generally provided between the second metal layer 2 and the conduction layer 3. The via holes penetrate through corresponding insulating layer(s). The one or more insulating layers are not shown in the drawings for purpose of clarity. That is, the method for manufacturing the array substrate includes, between the step S1 and step S2, and between the step S2 and the step S3, forming one or more insulating layers. For example, a first insulating layer is formed on the first metal layer 1, the second metal layer 2 is formed on the first insulating layer, a second insulating layer is formed on the second metal layer 2, the conduction layer 3 is formed on the second insulating layer, where the first via hole 4 penetrates through the first insulating layer and the second insulating layer, and the second via hole 5 penetrates through the second insulating layer.

It should be understood that, the order of above description does not indicates that operations are performed by the above order, for example, steps for forming patterns of the first via hole 4 and the second via hole 5 are generally implemented prior to a step for forming the conduction layer 3, and then a conductive material is filled into the patterns of the first via hole 4 and the second via hole 5 while forming the third pattern.

Specifically, the shielding ring 6 may be formed in following implementations. The step for forming the shielding ring 6 in the embodiments is merely illustrative, not intended to limit specific forming procedure thereof.

A first implementation is shown in FIG. 2. The conductive material shielding ring 6 is formed while forming the conduction layer 3 in the step S3, i.e., the conduction layer 3 and the shielding ring 6 are formed by means of one patterning process, such that the shielding ring 6 having a protection function and the conduction layer 3 adapted to electrically connect the first metal layer 1 to the second metal layer 2 can be formed at one time, thereby avoiding corrosion of the conductive layer by surrounding electric field.

The conduction layer 3 may be made of a transparent conductive metal oxide or a metal. Accordingly, the process of forming the conductive material shielding ring 6 while forming the conduction layer 3 may include: forming the shielding ring while forming a transparent conduction layer made of a transparent conductive metal oxide on the second insulating layer, where the transparent conduction layer and the shielding ring are formed by means of one patterning process, located at the same layer and made of the same material; or forming the shielding ring while forming a third metal layer on the second insulating layer, where the third metal layer and the shielding ring are formed by means of one patterning process, located at the same layer and made of the same material. The third metal layer is made of a metal, and the metal is not illustrated with specific examples in the embodiments.

A second implementation is shown in FIG. 3. The shielding ring may be alternatively formed in different layers of the array substrate. Specifically, the conductive material shielding ring 6 includes a first conductive material portion 7 and a second conductive material portion 8.

As shown in FIG. 3, in a case that the second metal layer 2 is formed between the first metal layer 1 and the conduction layer 3, the second conductive material portion 8 is formed near the second metal layer 2 while forming the second metal layer 2 in the step S2; and the first conductive material layer 7 is formed near the conduction layer 3 while forming the conduction layer 3 in the step S3. Specifically, the shielding ring 6 of the protection function is formed by connecting two ends of the first conductive material portion 7 to two ends of the second conductive material portion 8 via third via holes, thereby protecting the conductive layer 3 from getting adversely affected by surrounding electric field.

It is further provided a display device in the present disclosure, including the array substrate described above.

In embodiments, the display device may be any products and components having a display function, such as, an e-book, a mobile phone, a tablet computer, a television, a notebook computer, a digital picture frame, and a navigator.

In the specification of the present disclosure, numerous specific details are explained. However, it should be understood that, the embodiments of the present disclosure can be implemented without these specific details. In some instances, well-known methods, structures and technologies are not shown in detail, so as not to obscure the understanding of the specification.

Finally, it should be noted that, the above embodiments are merely to illustrate the technical solutions of the present disclosure, but not intended to limit them. Although the present disclosure is explained in detail with reference to the foregoing embodiments, it should be understood by those skilled in the art that, the technical solutions recorded in the foregoing embodiments may be modified, equivalent replacements can be performed on a part or all of the technical features thereof. Such modifications or replacements do not make the essence of corresponding technical solutions depart from the scope of the technical solutions of embodiments of the present disclosure, and should all be included in the scope of the claims and the specification of the disclosure.

What is claimed is:

1. An array substrate, comprising:
a first metal layer comprising a first pattern;
a second metal layer comprising a second pattern;
a conduction layer, located above the first metal layer and the second metal layer and comprising a third pattern;
a first via hole configured to directly connect the first pattern and the third pattern;
a second via hole configured to directly connect the second pattern and the third pattern; and
a conductive material shielding ring surrounding the third pattern, wherein the conductive material shielding ring is insulated from the third pattern.

2. The array substrate according to claim 1, wherein the conduction layer is arranged at a layer and made of a material identical to the conductive material shielding ring.

3. The array substrate according to claim 2, wherein the conductive layer is made of a transparent conductive metal oxide or a metal.

4. The array substrate according to claim 3, wherein the transparent conductive metal oxide is indium tin oxide.

5. The array substrate according to claim 1, wherein the conductive material shielding ring comprises a first conductive material portion and a second conductive material portion, the conduction layer is arranged at a layer and made of a material identical to the first conductive material portion, and the second metal layer is arranged at a layer and made of a material identical to the second conductive material portion; and
wherein the second metal layer is located between the first metal layer and the conduction layer.

6. The array substrate according to claim 5, wherein the first conductive material portion and the second conductive portion each have a half-frame shape, a semi-circle shape or any other shape having two ends.

7. The array substrate according to claim 6, wherein the first conductive material portion and the second conductive material portion are connected via third via holes, a whole structure of the first conductive material portion, the second conductive material portion and the third via holes surrounds the third pattern of the conduction layer.

8. The array substrate according to claim 7, wherein two ends of the first conductive material portion respectively overlap two ends of the second conductive material portion in a direction perpendicular to the conduction layer, and the third via holes are provided at regions where the first conductive material portion overlaps the second conductive material portion.

9. The array substrate according to claim 5, wherein the first conductive material portion is insulated from the conduction layer and the second conductive material portion is insulated from the second metal layer.

10. The array substrate according to claim 1, wherein one of the first metal layer and the second metal layer is a gate metal layer and the other is a source/drain metal layer.

11. The array substrate according to claim 1, wherein the first metal layer and the second metal layer are located at different layers.

12. A method for manufacturing an array substrate, wherein the array substrate comprises:
a first metal layer comprising a first pattern;
a second metal layer comprising a second pattern;
a conduction layer, located above the first metal layer and the second metal layer and comprising a third pattern;
a first via hole configured to directly connect the first pattern and the third pattern;
a second via hole configured to directly connect the second pattern and the third pattern; and
a conductive material shielding ring surrounding the third pattern, wherein the conductive material shielding ring is insulated from the third pattern;
wherein the method comprises steps of:
forming the first metal layer comprising the first pattern;
forming the second metal layer comprising the second pattern;
forming the first via hole on and directly connecting to the first pattern and forming the second via hole on and directly connecting to the second pattern;
forming the conduction layer comprising the third pattern and located above the first metal layer and the second metal layer, wherein the first via hole is covered by the third pattern and directly connects the first pattern and the third pattern, and the second via hole is covered by the third pattern and directly connects the second pattern and the third pattern; and
forming the conductive material shielding ring surrounding the third pattern and insulated from the third pattern.

13. The method according to claim 12, wherein the conductive material shielding ring is formed while forming the conduction layer.

14. The method according to claim 12, wherein the conductive material shielding ring comprises a first conductive material portion and a second conductive material portion; and
the step of forming the conductive material shielding ring surrounding the third pattern and insulated from the third pattern comprises: forming the first conductive material portion near the conduction layer while forming the conduction layer, and forming the second conductive material portion near the second metal layer while forming the second metal layer;
wherein the second metal layer is formed between the first metal layer and the conduction layer.

15. The method according to claim 14, further comprising: forming third via holes configured to connect the first conductive material portion and the second conductive material portion.

16. A display panel comprising an array substrate, wherein the array substrate comprises:
a first metal layer comprising a first pattern;
a second metal layer comprising a second pattern;
a conduction layer located above the first metal layer and the second metal layer and comprising a third pattern;
a first via hole configured to directly connect the first pattern and the third pattern;
a second via hole configured to directly connect the second pattern and the third pattern; and
a conductive material shielding ring surrounding the third pattern, wherein the conductive material shielding ring is insulated from the third pattern.

17. The display panel according to claim 16, wherein the conduction layer is arranged at a layer and made of a material identical to the conductive material shielding ring.

18. The display panel according to claim 16, wherein the conductive material shielding ring comprises a first conductive material portion and a second conductive material portion, the conduction layer is arranged at a layer and made of a material identical to the first conductive material portion, and the second metal layer is arranged at a layer and made of a material identical to the second conductive material portion; and wherein the second metal layer is located between the first metal layer and the conduction layer.

* * * * *